(12) United States Patent
Stainer

(10) Patent No.: US 10,115,445 B2
(45) Date of Patent: Oct. 30, 2018

(54) MAGNETIC MEMORY DEVICE THAT IS PROTECTED AGAINST READING USING AN EXTERNAL MAGNETIC FIELD AND METHOD FOR OPERATING SUCH MAGNETIC MEMORY DEVICE

(71) Applicant: CROCUS Technology SA, Grenoble (FR)

(72) Inventor: Quentin Stainer, Montbonnot-St-Martin (FR)

(73) Assignee: CROCUS TECHNOLOGY SA, Grenoble (FR)

( * ) Notice: Subject to any disclaimer, the term of this patent is extended or adjusted under 35 U.S.C. 154(b) by 0 days.

(21) Appl. No.: 15/741,805

(22) PCT Filed: Jun. 27, 2016

(86) PCT No.: PCT/IB2016/053820
§ 371 (c)(1),
(2) Date: Jan. 4, 2018

(87) PCT Pub. No.: WO2017/006210
PCT Pub. Date: Jan. 12, 2017

(65) Prior Publication Data
US 2018/0197591 A1 Jul. 12, 2018

(30) Foreign Application Priority Data
Jul. 7, 2015 (EP) .................................. 15290176

(51) Int. Cl.
*G11C 11/00* (2006.01)
*G11C 11/16* (2006.01)
(Continued)

(52) U.S. Cl.
CPC ........ *G11C 11/1673* (2013.01); *G11C 11/161* (2013.01); *G11C 11/1659* (2013.01);
(Continued)

(58) Field of Classification Search
CPC ... G11C 11/00; G11C 11/1673; G11C 11/161; G11C 11/1659; G11C 11/1675;
(Continued)

(56) References Cited

U.S. PATENT DOCUMENTS 6,667,901 B1    12/2003   Perner et al.
8,611,141 B2 *  12/2013   Baraji ..................... G11C 11/16
                                                            365/158

(Continued)

FOREIGN PATENT DOCUMENTS

WO    2008040561 A2    4/2008
WO    2013123363 A1    8/2013

OTHER PUBLICATIONS

International Search Report for PCT/IB2016/053820 dated Nov. 17, 2016.
Written Opinion for PCT/IB2016/053820 dated Nov. 17, 2016.

*Primary Examiner* — Harry W Byrne
(74) *Attorney, Agent, or Firm* — Pearne & Gordon LLP

(57) ABSTRACT

A magnetic memory device including a plurality of magnetic units, each unit including a first and second magnetic tunnel junctions—electrically connected in series by a current line and a strap. Each junction includes a first and second storage layer having a first and second storage magnetization and a first sense magnetic layer having a first and second senses magnetization. A field line is configured to provide an input signal generating a first and second magnetic field for varying the first and second sense magnetization. Each magnetic unit is provided with a data state such that the first and second storage magnetizations are aligned in opposed directions. The first and second magnetic field are adapted for varying respectively the first and second sense magnetization in a first and second direction opposed to the first direction.

9 Claims, 5 Drawing Sheets

(51) Int. Cl.
*H01L 43/08* (2006.01)
*H01L 27/22* (2006.01)
*H01F 10/32* (2006.01)
*H01L 43/02* (2006.01)

(52) U.S. Cl.
CPC ...... *G11C 11/1675* (2013.01); *H01F 10/3254* (2013.01); *H01F 10/3268* (2013.01); *H01L 27/222* (2013.01); *H01L 43/02* (2013.01); *H01L 43/08* (2013.01)

(58) Field of Classification Search
CPC ............. H01F 10/3254; H01F 10/3268; H01L 27/222; H01L 43/02; H01L 43/08
USPC ....... 365/48, 55, 62, 66, 74, 78, 80–93, 100, 365/130, 131, 148, 158, 171–173, 209, 365/213, 225.5, 230.07, 232, 243.5
See application file for complete search history.

(56) References Cited

U.S. PATENT DOCUMENTS

| | | | |
|---|---|---|---|
| 9,461,093 B2* | 10/2016 | Conraux | G11C 11/16 |
| 2005/0157540 A1 | 7/2005 | Perner et al. | |
| 2013/0070521 A1* | 3/2013 | El Baraji | G11C 11/16 365/158 |
| 2015/0287764 A1* | 10/2015 | Conraux | G11C 11/16 257/421 |

* cited by examiner

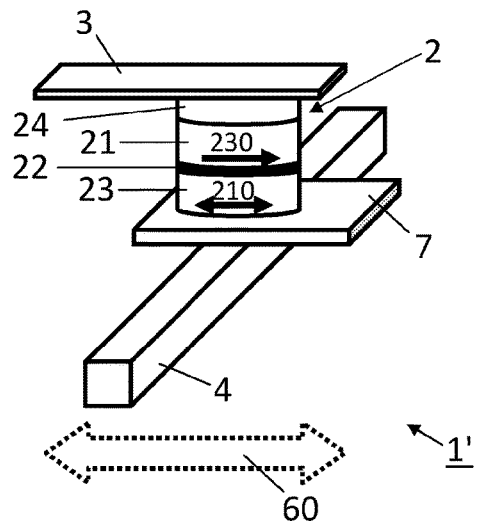 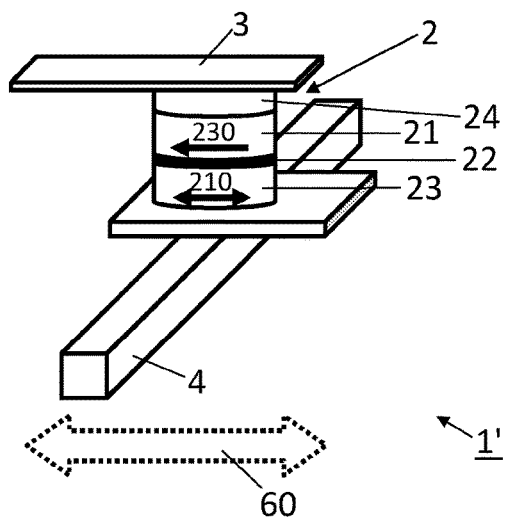
Fig. 2 (a)   Fig. 2 (b)
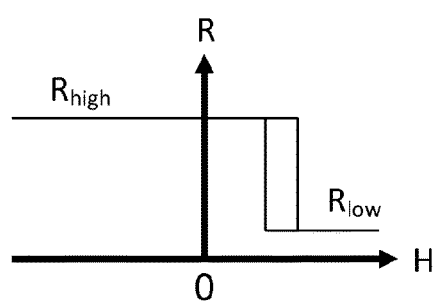 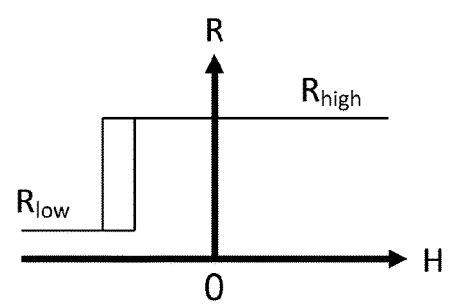
Fig. 3 (a)   Fig. 3 (b)

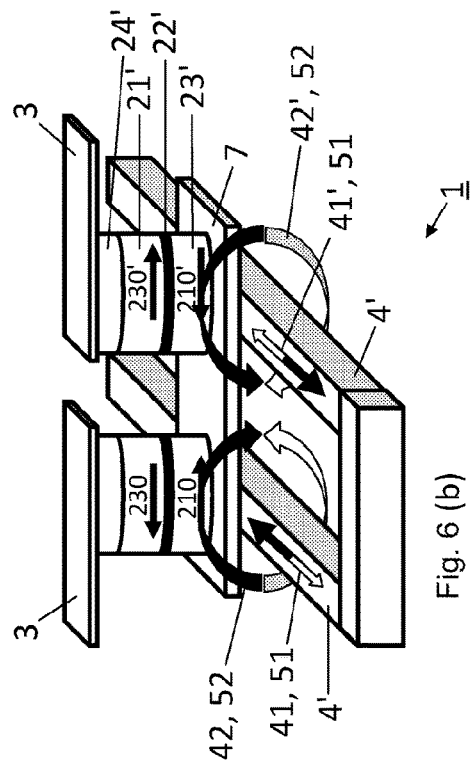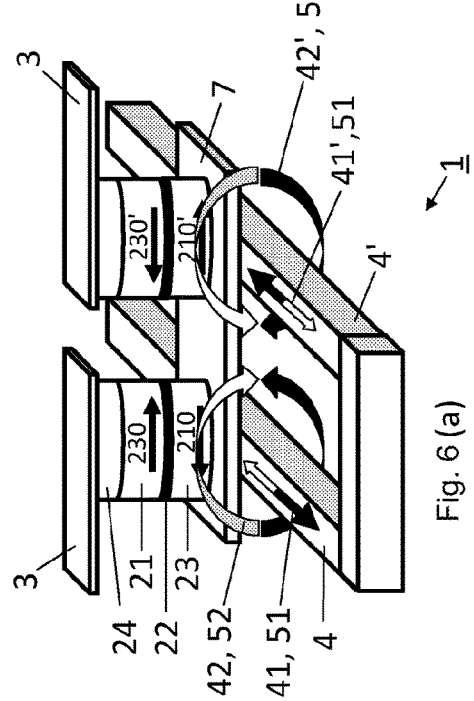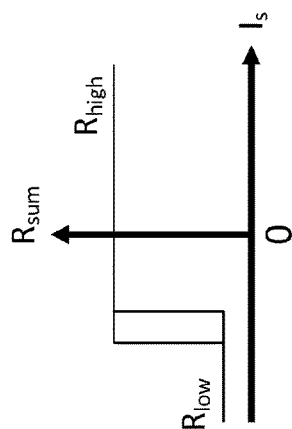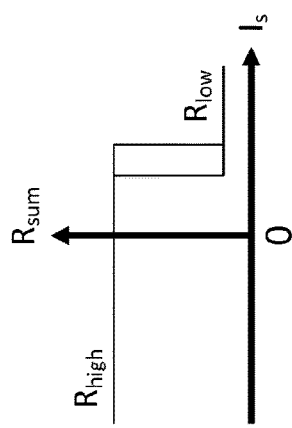

MAGNETIC MEMORY DEVICE THAT IS PROTECTED AGAINST READING USING AN EXTERNAL MAGNETIC FIELD AND METHOD FOR OPERATING SUCH MAGNETIC MEMORY DEVICE

FIELD

The present invention concerns a magnetic memory device that can be read using a self-reference read operation and that is protected against reading using an external magnetic field. The present invention also concerns a method for operating the magnetic memory device.

DESCRIPTION OF RELATED ART

A MRAM-based memory unit using the so-called self-referenced reading operation typically comprises a magnetic tunnel junction formed of a magnetic storage layer having a first storage magnetization, a thin insulating layer, and a sense layer having a sense magnetization with a reversible direction with respect to the storage magnetization. The self-referenced MRAM cell allows for performing write and read operations with low power consumption and an increased speed. Self-referenced memory units can further be read by using a dynamic reading operation having improved robustness against variability from one memory unit to another.

A self-referenced reading operation of the memory unit typically comprises applying a magnetic field adapted for aligning the sense magnetization in a first direction and applying a second read magnetic field adapted for aligning the sense magnetization in a second direction opposed to the first direction. A data stored in the memory unit can then be determined by measuring a resistance difference between the memory unit having the sense magnetization oriented in the first and second directions.

During the reading operation, the magnetic field is applied by passing a field current in a field line addressing the memory unit. However, the magnetic field can also be generated externally, for instance with an electromagnet.

As a result, the data stored in the memory unit can be retrieved by measuring a resistance of the memory unit while applying the external magnetic field. Since the memory can be operated externally and read without the controller, it is vulnerable to security attacks.

WO2013123363 discloses an apparatus which includes a circuit and a field line. The circuit includes a magnetic tunnel junction including a storage layer and a sense layer. The field line is configured to generate a magnetic field based on an input signal, where the magnetic tunnel junction is configured such that a magnetization direction of the sense layer and a resistance of the magnetic tunnel junction vary based on the magnetic field. The circuit is configured to amplify the input signal to generate an output signal that varies in response to the resistance of the magnetic tunnel junction.

US2005157540 discloses a soft-reference four conductor magnetic memory storage device. In a particular embodiment, there are a plurality of parallel electrically conductive first sense conductors and a plurality of parallel electrically conductive second sense conductors. The first and second sense conductors may provide a cross point array or a series connected array. Soft-reference magnetic memory cells are provided in electrical contact with and located and at each intersection. In addition there are a plurality of parallel electrically conductive write rows substantially proximate to and electrically isolated from the first sense conductors. A plurality of parallel electrically conductive write columns transverse to the write rows, substantially proximate to and electrically isolated from the second sense conductors, forming a write cross point array with a plurality of intersections, is also provided. Sense magnetic fields generated by at least one conductor orient the soft-reference layer but do not alter the data stored within the cell.

U.S. Pat. No. 6,667,901 discloses a magnetic memory device includes a first magnetic tunnel junction having a first reference ferromagnetic layer; a second magnetic tunnel junction having a second reference ferromagnetic layer; and an electrically conductive spacer layer between the first and second reference layers. The first and second reference layers are antiferromagnetically coupled.

WO2008040561 discloses a content-addressable random access memory having magnetic tunnel junction-based memory cells and methods for making and using same. The magnetic tunnel junction has first and second magnetic layers and can act as a data store and a data sense. Within each cell, registered data is written by setting a magnetic orientation of the first magnetic layer in the magnetic tunnel junction via current pulses in one or more current lines. Input data for comparison with the registered data can be similarly set through the magnetic orientation of the second magnetic layer via the current lines. The data sense is performed by measuring cell resistance, which depends upon the relative magnetic orientation of the magnetic layers.

SUMMARY

According to the present disclosure, a magnetic memory device configured to be used with a self-referenced read operation, the memory comprising a plurality of magnetic units, each unit including:

a first magnetic tunnel junction comprising a first storage layer having a first storage magnetization and a first sense magnetic layer having a first sense magnetization;

a second magnetic tunnel junction comprising a second storage layer having a second storage magnetization and a second sense magnetic layer having a second sense magnetization;

a current line and a strap electrically connecting the first and second magnetic tunnel junctions in series;

a field line configured to provide, during the read operation, an input signal generating a first magnetic field adapted for varying the first sense magnetization and a first resistance of the first magnetic tunnel junction, and a second magnetic field adapted for varying the second sense magnetization direction and a second resistance of the second magnetic tunnel junction;

the current line being configured for providing an output signal that varies in response to the sum of the resistances of the first and second magnetic tunnel junctions of each of said plurality of magnetic units;

wherein each magnetic unit is provided with a data state such that the first storage magnetization is aligned in a direction opposed to the one of the second storage magnetization; and wherein the first magnetic field is adapted for varying the first sense magnetization in a first direction and the second magnetic field is adapted for varying the second sense magnetization in a second direction opposed to the first direction.

The present disclosure further pertains to a method for operating the magnetic memory device, comprising:

providing a data state to be read in each magnetic unit such that the first storage magnetization direction is aligned in a direction opposed to the one of the second storage magnetization;

providing an input to the field line such as to align the first sense magnetization and the second sense magnetization in opposed directions, measuring the sum of the resistances of the first and second magnetic tunnel junctions of said plurality of magnetic units; and determining the stored data state from the measured sum of the resistances.

The magnetic memory device disclosed herein cannot be read by using an external magnetic field, but only by passing an input signal in the input line. The magnetic memory device is thus not vulnerable to security attacks.

BRIEF DESCRIPTION OF THE DRAWINGS

The invention will be better understood with the aid of the description of an embodiment given by way of example and illustrated by the figures, in which:

FIGS. 2a and 2b illustrate a conventional magnetic unit comprising a single magnetic tunnel junction;

FIGS. 3a and 3b show the variation of the magnetic tunnel junction resistance upon the application of the external magnetic field for the conventional magnetic unit of FIGS. 2a and 2b respectively;

FIGS. 6a and 6b illustrate a method for operating a magnetic unit of the magnetic memory device, according to an embodiment;

FIGS. 7a and 7b report the variation of the sum of the resistances of a magnetic unit with respect to a field current provided to the magnetic unit of FIGS. 6a and 6b, respectively.

DETAILED DESCRIPTION OF POSSIBLE EMBODIMENTS

Figure 1:
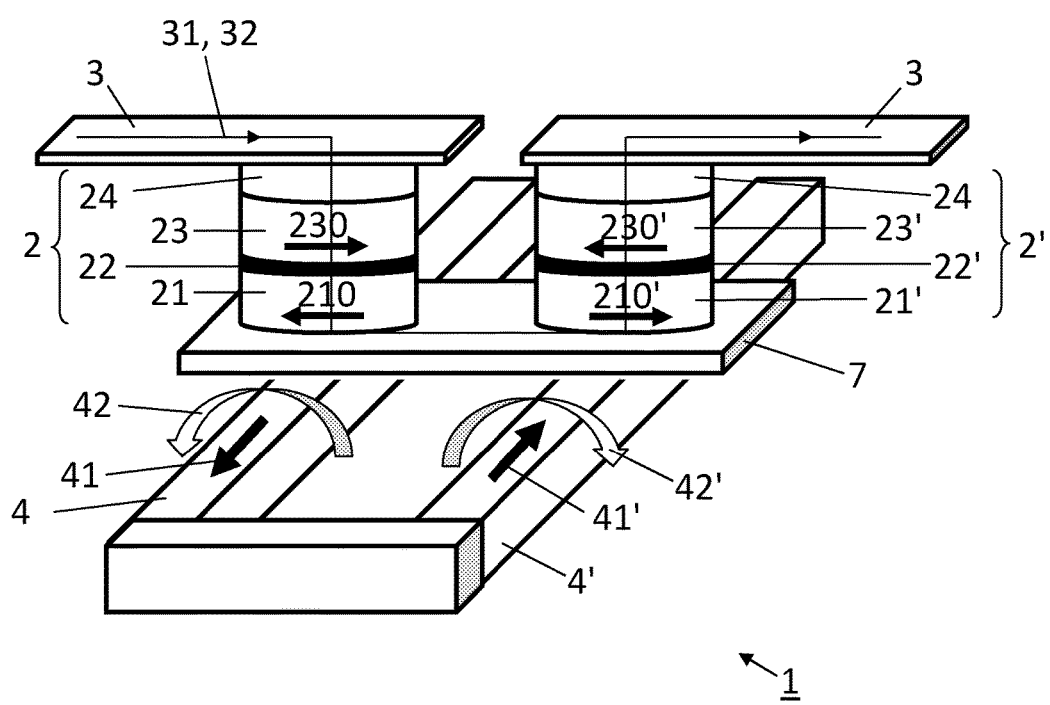
FIG. 1 shows a magnetic unit of a magnetic memory device, according to an embodiment.

FIG. 1 shows a magnetic unit 1 of a magnetic memory device, according to an embodiment. The magnetic unit 1 comprises a first magnetic tunnel junction 2 including a first storage layer 23 having a first storage magnetization 230 and a first sense magnetic layer 21 having a first sense magnetization 210. The magnetic unit 1 further comprises a second magnetic tunnel junction 2' including a second storage layer 23' having a second storage magnetization 230' and a second sense magnetic layer 21' having a second sense magnetization 210'. Each of the first and second magnetic tunnel junction 2, 2' further includes respectively a first tunnel barrier layer 22 between the first sense layer 21 and the first storage layer 23, and a second tunnel barrier layer 22' between the second sense layer 21' and the second storage layer 23'. The first and second sense magnetization 210, 210' can be varied with respect to the first and second storage magnetization 230'.

The first and second magnetic tunnel junctions 2, 2' are electrically connected in series via an electrically conductive current line 3 and a conductive strap 7.

The magnetic unit 1 further comprises a field line 4 configured to provide, during a read operation, an input signal 41 generating a first magnetic field 42 adapted for varying the first sense magnetization 210 and a first resistance $R_1$ of the first magnetic tunnel junction 2, and a second magnetic field 42' adapted for varying the second sense magnetization direction 210' and a second resistance $R_2$ of the second magnetic tunnel junction 2'. The first magnetic field 42 is adapted for varying the first sense magnetization 210 in a first direction and the second magnetic field 42' is adapted for varying the second sense magnetization 210' in a second direction opposed to the first direction.

Each of the sense layers 21, 21' and the storage layers 23, 23' includes, or is formed of, a magnetic material and, in particular, a magnetic material of the ferromagnetic type. A ferromagnetic material can be characterized by a substantially planar magnetization with a particular coercivity, which is indicative of a magnitude of a magnetic field to reverse the magnetization after it is driven to saturation in one direction. In general, the sense layer 21, 21' and the storage layer 23, 23' can include the same ferromagnetic material or different ferromagnetic materials. The sense layer 21, 21' can include a soft ferromagnetic material, namely one having a relatively low coercivity, while the storage layer 23, 23' can include a hard ferromagnetic material, namely one having a relatively high coercivity. In such manner, a magnetization 210, 210' of the sense layer 21, 21' can be readily varied under low-intensity magnetic fields generated in response to the input signal 41 while the storage magnetization 230, 230' remains stable. Suitable ferromagnetic materials include transition metals, rare earth elements, and their alloys, either with or without main group elements. For example, suitable ferromagnetic materials include iron (Fe), cobalt (Co), nickel (Ni), and their alloys, such as permalloy (or Ni 80Fe 20); alloys based on Ni, Fe, and boron (B); CoFe; and alloys based on Co, Fe, and B. In some instances, alloys based on Ni and Fe (and optionally B) can have a smaller coercivity than alloys based on Co and Fe (and optionally B). A thickness of each of the sense layer 21, 21' and the storage layer 23, 23' can be in the nm range, such as from about 1 nm to about 20 nm. Other implementations of the sense layer 21, 21' and the storage layer 23 are contemplated. For example, either, or both, of the sense layer 21, 21' and the storage layer 23, 23' can include multiple sub-layers in a fashion similar to that of the so-called synthetic antiferromagnetic layer.

Each of the tunnel barrier layer 22, 22' includes, or is formed of, an insulating material. Suitable insulating materials include oxides, such as aluminum oxide (e.g., $Al_2O_3$) and magnesium oxide (e.g., MgO). A thickness of each of the tunnel barrier layer 22, 22' can be in the nm range, such as from about 1 nm to about 10 nm.

In the variant illustrated in FIG. 1, the magnetic tunnel junction 2, 2' also includes respectively a first pinning layer 24, which is disposed adjacent to the first storage layer 23, and a second pinning layer 24', which is disposed adjacent to the second storage layer 23'. Through exchange bias, the pinning layer 24, 24' stabilizes respectively the storage magnetization 230, 230' along a particular one of the pair of directions when a temperature within, or in the vicinity of, the pinning layer 24, 24' is at a low temperature threshold $T_L$. The pinning layers 24, 24' unpins, or decouples, the storage magnetization 230, 230' when the temperature is at a high temperature threshold $T_H$, thereby allowing the storage magnetization 230, 230' to be switched to another one of the pair of directions.

Each of the pinning layer 24, 24' includes, or is formed of, a magnetic material and, in particular, a magnetic material of the antiferromagnetic type. Suitable antiferromagnetic materials include transition metals and their alloys. For example, suitable antiferromagnetic materials include alloys based on manganese (Mn), such as alloys based on iridium (Ir) and Mn (e.g., IrMn); alloys based on Fe and Mn (e.g., FeMn); alloys based on platinum (Pt) and Mn (e.g., PtMn); and alloys based on Ni and Mn (e.g., NiMn). In some instances, the high temperature threshold $T_H$, of alloys based on Ir and Mn (or based on Fe and Mn) can be in the range of about 120° C. to about 220° C. or about 150° C. to about 200° C., such as about 200° C., and can be smaller than the the high temperature threshold $T_H$ of alloys based on Pt and Mn (or based on Ni and Mn), which can be in the range of about 300° C. to about 350° C.

In one embodiment, such a pinning layer is omitted adjacent to the sense layer 21, 21', and, as a result, the sense layer 21, 21' has a sense magnetization 210, 210' that is unpinned and is readily varied, with the substantial absence of exchange bias.

In an embodiment, the input signal 41 is a field current. As illustrated in FIG. 1, the field line can comprise a first line portion 4 for passing a first current portion 41 of the field current and generating the first magnetic field 42. The field line can further comprise a second line portion 4' for passing a second current portion 41' of the field current and generating the second magnetic field 42'. The second current portion 41' has a polarity opposed to the one of the first current portion 41 such that the first magnetic field 42 is oriented in a direction that is opposed to the direction of the second magnetic field 42'.

Consequently, when the input signal 41 is provided to the field line 4, the first magnetic field 42 orients the first sense magnetization 210 in a first direction in accordance to the direction of first magnetic field 42 and the second magnetic field 42' orients the second sense magnetization 210' in a second direction in accordance to the direction of second magnetic field 42' that is opposed to the first direction.

In the example illustrated in FIG. 1, the field line 4 is U-shaped and the first line portion 4 is electrically connected in series to the second line portion 4'. In such a configuration of the field line 4, when the input signal 41 is provided to the field line 4, the first and second current portions 41, 41' flow in the field line 4 with opposed polarities.

Alternatively, the first line portion 4 and the second line portion 4' can be addressable independently. Here, the first current portion 41 can be passed in the first line portion 4 independently from passing the second current portion 41' in the first line portion 4'. The first and second current portions 41, 41' are passed with opposed polarities.

The magnetic unit 1 is provided with a data state such that the first storage magnetization 230 is aligned in a direction opposed to the one of the second storage magnetization 230'.

Figure 8:
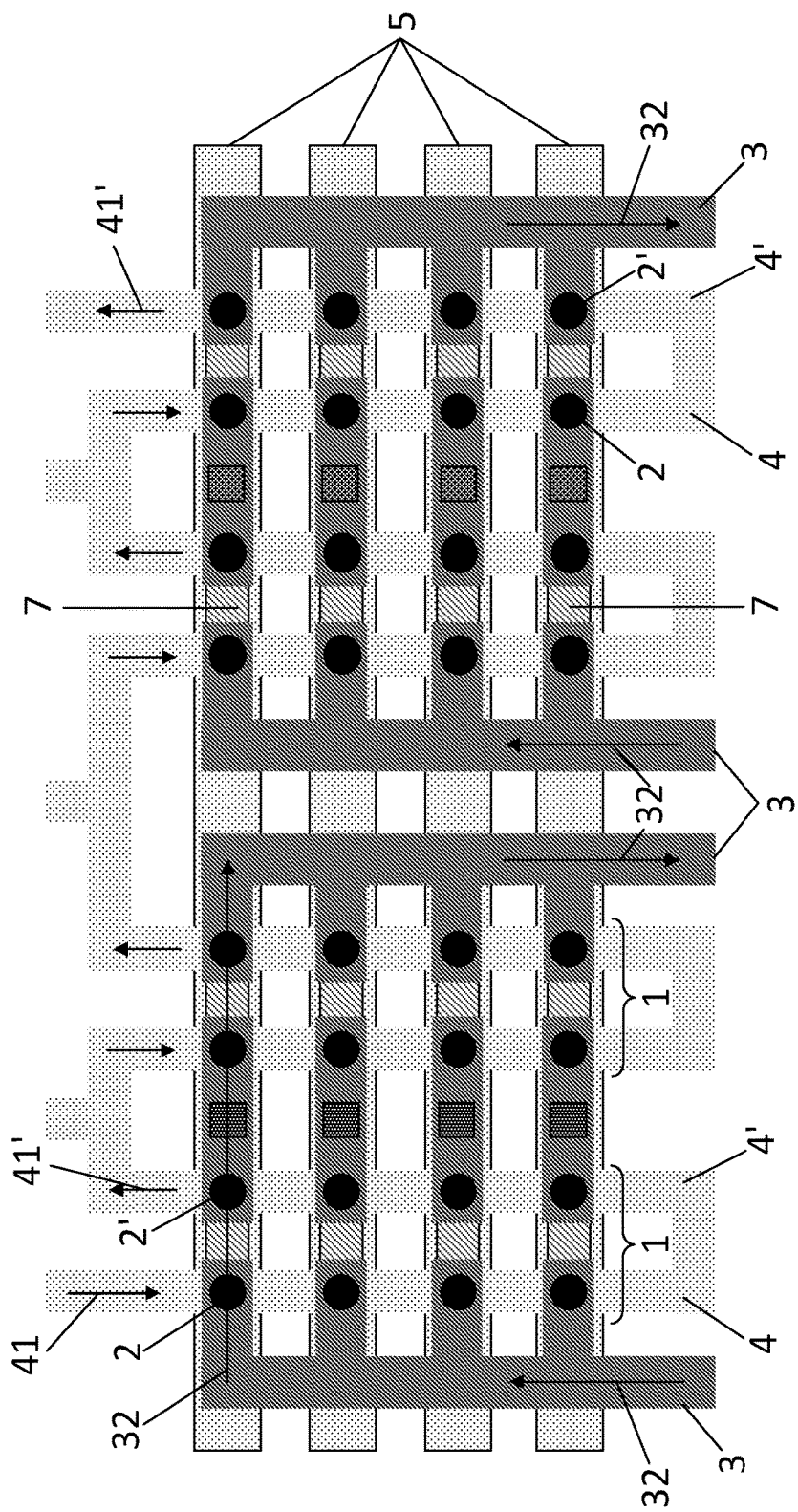
FIG. 8 shows a magnetic memory device comprising a plurality of the magnetic unit, according to an embodiment.

FIG. 8 shows a top view of a magnetic memory device 100, according to an embodiment. The magnetic memory device 100 comprises a plurality of the magnetic unit 1 arranged along rows and columns. The current line 3 is configured for passing a sense current 32 adapted for measuring the first resistance $R_1$ of the first magnetic tunnel junction 2 the second resistance $R_2$ of the second magnetic tunnel junction 2' of each magnetic unit 1 in the magnetic memory device 100 and to providing an output signal 132 that varies in response to the sum of the resistances $R_1$, $R_2$.

In the example of FIG. 8, four rows, each containing two magnetic units 1, are addressed by the current line 3 and the field line 4, with the first and second line portion 4, 4' being arranged in a serpentine configuration. The strap 7 connecting the first and second magnetic tunnel junctions 2, 2' in a magnetic unit 1 and word lines 5 addressing the magnetic units 1 along a row are also visible.

According to an embodiment, a method for operating the magnetic memory device 100 comprises:

providing a data state to be read in each magnetic unit 1 such that the first storage magnetization direction 230 is aligned in a direction opposed to the one of the second storage magnetization direction 230';

providing an input 41 to the field line 4 such as to align the first sense magnetizations 210 and the second sense magnetizations 210' in opposed directions, measuring the sum of the resistances $R_1$, $R_2$ of the first and second magnetic tunnel junctions 2, 2' of said plurality of magnetic units 1; and determining the stored data state from the measured sum of the resistances $R_1$, $R_2$.

As illustrated in FIGS. 6a and 6b for a single magnetic unit 1, a data state is provided in the magnetic unit 1 such that the first storage magnetization 230 of the first magnetic tunnel junction 2 is oriented in an opposite direction than the one of the second storage magnetization 230' of the second magnetic tunnel junction 2'. In particular, in FIG. 6a the first storage magnetization 230 is oriented towards the right and the second storage magnetization 230' is oriented towards the left. In FIG. 6b, the first storage magnetization 230 is oriented towards the left and the second storage magnetization 230' is oriented towards the right.

The input signal 41 is provided by passing a field current 41 in the field line 4. In particular, the field current comprises a first current portion 41 passing in the first line portion 4 and passing a second current portion 41' in the second line portion 4'. Due to the U-shape arrangement of the first and second line portions 4, 4', the first current portion 41 flows with a polarity that is opposed to the one of the second current portion 41'. The first magnetic field 42 generated by the first current portion 41 is thus oriented in a direction opposed to the one of the second magnetic field 42' generated by the second current portion 41', such that the first and second sense magnetizations 210, 210' are aligned in opposed directions.

In an embodiment, the field current 41 is provided with a first polarity and a first sum of the resistances $R_1$, $R_2$ is measured. The field current 41 is then provided with a second polarity and a second sum of the resistances $R'_1$, $R'_2$ is measured.

The stored data state can then be determined by determining a relative difference between the first sum of the resistance $R_1$, $R_2$ and the second sum of the resistance $R'1$, $R'2$.

Measuring the first and second sum $R_{sum}$ of the resistances $R_1$, $R_2$, $R'_1$, $R'_2$ can be performed by passing the sense current 32 in the first and second magnetic tunnel junctions 2, 2', via the current line 3 (see FIG. 1). Alternatively, the first and second sum $R_{sum}$ of the resistances $R_1$, $R_2$, $R'_1$, $R'_2$ can be measured by applying a voltage between the magnetic tunnel junctions 2, 2' in series.

FIGS. 7a and 7b report the variation of the sum of the resistances $R_{sum}$ with respect to the field current 41 (represented as $I_s$) provided to the magnetic unit 1 of FIGS. 6a and 6b, respectively. In FIGS. 7a and 7b, it is assumed that prior to providing the field current 41 the first and second sense magnetization 210, 210' is oriented antiparallel to the first and second storage magnetization 230, 230' such that the sum of the resistances $R_{sum}$ has a high resistance value $R_{high}$. In FIGS. 7a and 7b, it is further assumed that the field current 41 is passed in the first and second line portions 4, 4' with an alternating polarity.

Referring to FIG. 6a, the field current 41 can be provided in the first and second field line portions 4, 4' with an alternating polarity. In that case, when the polarity of the field current 41 is negative (represented by the black arrows 41, 41', 42, 42' in FIG. 6a), the first and second sense magnetizations 210, 210' are aligned in a first set of opposed directions being oriented antiparallel respectively to the first and second storage magnetization 230, 230'. This results in reading a "1, 1" data state, since both resistances $R_1$, $R_2$ of the first and second magnetic tunnel junctions 2, 2' are high such that the sum of the resistances $R_{sum}$ has a high resistance value $R_{high}$. When the polarity of the field current 41 becomes positive (represented by the white arrows 41, 41', 42, 42' in FIG. 6a) the first and second sense magnetizations 210, 210' are aligned in a second set of opposed directions being oriented parallel to the first and second storage magnetization 230, 230'. This results in reading a "0, 0" data state, since both resistances $R_1$, $R_2$ of the first and second magnetic tunnel junctions 2, 2' are low such that the sum of the resistances $R_{sum}$ has a low resistance value $R_{low}$. In FIG. 7a this is illustrated by the sum of the resistances $R_{sum}$ that varies from a high value $R_{high}$ to a low value $R_{low}$ when the field current 41 becomes positive (when the field current 41 is above a threshold value adapted for aligning the sense magnetization 210, 210').

Referring to FIG. 6b, In the case the polarity of the field current 41 is positive (represented by the black arrows 41, 41', 42, 42' in FIG. 6b), the first and second sense magnetization 210, 210' are aligned in a first set of opposed directions being oriented antiparallel respectively to the first and second storage magnetization 230, 230'. This results in reading a "1, 1" data state, since both resistances $R_1$, $R_2$ of the first and second magnetic tunnel junctions 2, 2' are high such that the sum of the resistances $R_{sum}$ has a high resistance value $R_{high}$. When the polarity of the field current 41 becomes positive (represented by the white arrows 41, 41', 42, 42' in FIG. 6b), the first and second sense magnetizations 210, 210' are aligned in a first set of opposed directions being oriented parallel to the first and second storage magnetization 230, 230'. This results in reading a "0, 0" data state, since both resistances $R_1$, $R_2$ of the first and second magnetic tunnel junctions 2, 2' are low such that the sum of the resistances $R_{sum}$ has a low resistance value $R_{low}$. In FIG. 7b this is illustrated by the sum of the resistances $R_{sum}$ that varies, from right to left, from a high value $R_{high}$ to a low value $R_{low}$ when the field current 41 becomes negative (when the field current 41 is above a threshold value adapted for aligning the sense magnetization 210, 210').

The high resistance value $R_{high}$ and the low resistance value $R_{low}$ of the sum of the resistances $R_{sum}$ can be easily distinguished by the reading operation of the data states.

In an embodiment, the first and second magnetic tunnel junction 2, 2' comprises a first and second antiferromagnetic layer 24, 24' and providing a data state comprises:

passing a heating current 31 in the current line 3 to heat the first and second magnetic tunnel junctions 2, 2' at the high temperature threshold $T_H$ such as to free the first and second storage magnetizations 230, 230';

passing a write current 51 in the field line 4 such as to generate a first write magnetic field 52 adapted for aligning the first storage magnetization 230 in a first direction, and as to generate a second write magnetic field 52' adapted for aligning the second storage magnetization 230' in a second written direction opposed to the first written direction; and cooling the first and second magnetic tunnel junctions 2, 2' to the low temperature threshold $T_L$ such as to pin the first and second storage magnetizations 230, 230' in the stored state.

An advantage of the magnetic unit 1 disclosed herein is that the data state cannot be read by using an external magnetic field, i.e., a magnetic field that is not generated by passing an input signal 41 in the input line 4. Indeed, the magnetic memory device can only be read by providing an input 41 in the field line 4.

FIGS. 2a and 2b illustrate a conventional magnetic unit 1' comprising a single magnetic tunnel junction 2 addressed by a single field line 4. The magnetic tunnel junction 2 is represented having the storage magnetization 230 oriented towards the right (data state "1", FIG. 2a) and towards the left (data state "0", FIG. 2b). With such a configuration, an external magnetic field 60 alternatively directed toward the right and the left can be used to read the data state written in the conventional magnetic unit. FIGS. 3a and 3b show the variation the magnetic tunnel junction resistance R upon the application of the external magnetic field 60 (represented by H in FIGS. 3a and 3b) for the conventional magnetic unit 1' of FIGS. 2a and 2b respectively, when the external magnetic field 60 is directed positively toward the right.

Figure 4A:
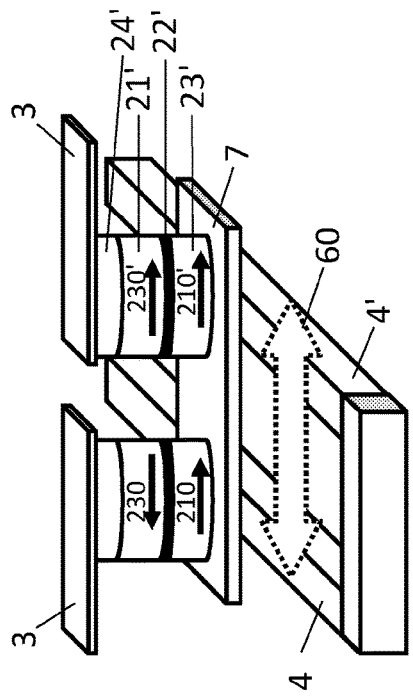
FIGS. 4a and 4b illustrate an external magnetic field being applied to the magnetic unit of the invention.

FIG. 4a illustrates an external magnetic field 60 being applied to the magnetic unit 1 of FIG. 6a. An external magnetic field 60 applied toward the left orients the first and second sense magnetization 210, 210' in the same direction, in accordance with the external magnetic field 60. This results in the first and second magnetization 210, 210' being oriented respectively antiparallel and parallel to the storage magnetization 230, 230', resulting in reading a "1, 0" data state, corresponding to the sum of the resistances $R_{sum}$ having an average resistance value $R_{avg}$ between the high resistance value $R_{high}$ and the low resistance value $R_{low}$. When the external magnetic field 60 is applied toward the right, the first and second sense magnetization 210, 210' are oriented respectively parallel and antiparallel to the storage magnetization 230, 230', resulting in reading a "0, 1" data state and to an average resistance value $R_{avg}$ of the sum of the resistances $R_{sum}$.

Figure 5A:
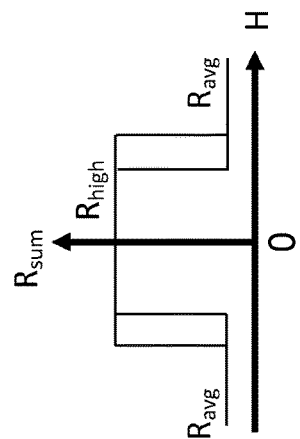
FIGS. 5a and 5b show the variation of the sum of the resistances upon the application of the external magnetic field for the configuration of FIG. 4a (FIG. 5a) and of FIG. 4b (FIG. 5b)

FIG. 5a shows the variation of the sum of the resistances $R_{sum}$ of the resistances $R_1$ and $R_2$ upon the application of the external magnetic field 60 (represented by H) for the magnetic unit 1 of FIG. 4a. The sum of the resistances $R_{sum}$ varies from the average resistance value $R_{avg}$ for the external magnetic field 60 being negative and positive, to a high resistance value $R_{high}$ when the magnitude of the external magnetic field 60 is below a threshold value adapted for aligning the first and second sense magnetization 210, 210' antiparallel to the first and second storage magnetization 230, 230'.

Figure 4B:
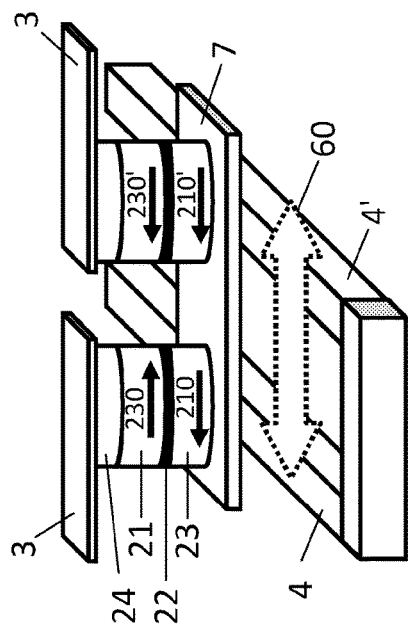

FIG. 4b illustrates the external magnetic field 60 being applied to the magnetic unit 1 of FIG. 6b. The external magnetic field 60 applied toward the left orients the first and second sense magnetization 210, 210' respectively parallel and antiparallel to the storage magnetization 230, 230', resulting in reading a "0, 1" data state, corresponding to the sum of the resistances $R_{sum}$ having an average resistance value $R_{avg}$. The external magnetic field 60 is applied toward the right, the first and second sense magnetization 210, 210' are oriented respectively antiparallel and parallel to the storage magnetization 230, 230', resulting in reading a "1, 0" data state and also to an average resistance value $R_{avg}$ of the sum of the resistances $R_{sum}$.

Figure 5B:
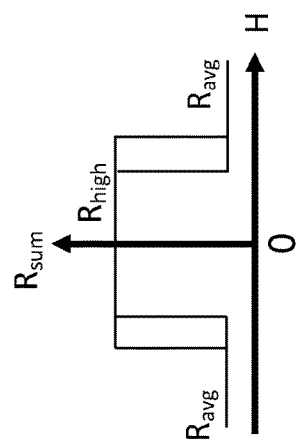

FIG. 5b shows the variation of the sum of the resistances $R_{sum}$ of the resistances $R_1$ and $R_2$ upon the application of the external magnetic field 60 (represented by H) for the magnetic unit 1 of FIG. 4b. The sum of the resistances $R_{sum}$ varies the same manner as in FIG. 5a, wherein the sum of the resistances $R_{sum}$ has a high resistance value $R_{high}$, when the magnitude of the external magnetic field 60 is below a threshold value and has an average resistance value $R_{avg}$ otherwise.

The resistance response of the magnetic unit 1 in the configuration of FIG. 4a cannot be distinguished from the one of FIG. 4b by using an external magnetic field 60. Consequently, a data state stored in the magnetic unit 1 of the invention cannot be read by using an external magnetic field 60.

A data state stored in the magnetic unit 1 of the magnetic memory device 100 can only be read when the input signal 41 is provided to the field line 4. The magnetic memory device 100 of the invention is this not vulnerable to security attacks.

| Reference Numbers and Symbols | |
|---|---|
| 1 | magnetic unit |
| 1' | conventional magnetic unit |
| 100 | magnetic memory device |
| 132 | output signal |
| 2 | first magnetic tunnel junction |
| 2' | second magnetic tunnel junction |
| 21 | first sense layer |
| 21' | second sense layer |
| 210 | first sense magnetization |
| 210' | second sense magnetization |
| 22 | first tunnel barrier layer |
| 22' | second tunnel barrier layer |
| 23 | first storage layer |
| 23' | second storage layer |
| 230 | first storage magnetization |
| 230' | second storage magnetization |
| 24 | first pinning layer |
| 24' | second pinning layer |
| 3 | current line |
| 31 | heating current |
| 32 | sense current |
| 4 | input line, first line portion |
| 4' | second line portion |
| 41 | input signal, first field current portion |
| 41' | input signal, second field current portion |
| 42 | first magnetic field |
| 42' | second magnetic field |
| 5 | word line |
| 51 | write current |
| 52 | first write magnetic field |
| 52' | second write magnetic field |
| 60 | external magnetic field |
| 7 | strap |
| H | external magnetic field |
| R | junction resistance |
| $R_1$ | first junction resistance |
| $R_2$ | second junction resistance |
| $R_{av}$ | average resistance value |
| $R_{high}$ | high resistance value |
| $R_{low}$ | low resistance value |
| $R_{sum}$ | sum of the resistances $R_1$, $R_2$ |
| $T_H$ | high temperature threshold |
| $T_L$ | low temperature threshold |

What is claimed is:

1. A magnetic memory device configured to be used with a self-referenced read operation, the memory comprising a plurality of magnetic units, each unit including:

a first magnetic tunnel junction comprising a first storage layer having a first storage magnetization and a first sense magnetic layer having a first sense magnetization;

a second magnetic tunnel junction comprising a second storage layer having a second storage magnetization and a second sense magnetic layer having a second sense magnetization;

a current line and a strap electrically connecting the first and second magnetic tunnel junctions in series;

a field line comprising:
   a first line portion for passing, during the read operation, a first current portion of a field current, the first current portion generating a first magnetic field adapted for varying the first sense magnetization and a first resistance of the first magnetic tunnel junction; and
   a second line portion for passing a second current portion of the field current, the second current portion generating a second magnetic field adapted for varying the second sense magnetization direction and a second resistance of the second magnetic tunnel junction, the second current portion having a polarity opposed to the one of the first current portion;

each magnetic unit being provided with a data state such that the first storage magnetization is aligned in a direction opposed to the one of the second storage magnetization;

wherein the first magnetic field is adapted for varying the first sense magnetization in a first direction and the second magnetic field is adapted for varying the second sense magnetization in a second direction opposed to the first direction, such that, in each magnetic unit either, the first storage magnetization is parallel to the first sense magnetization and the second sense magnetization, or the first storage magnetization is antiparallel to the first sense magnetization and to the second sense magnetization;

the current line being configured for providing an output signal that varies in response to the sum of the resistances of the first and second magnetic tunnel junctions of each of said plurality of magnetic units, such that said data state can be determined only when the input signal is provided to the field line.

2. The magnetic memory device according to claim 1, wherein the first line portion and the second line portion are addressable independently, such that the first current portion can be passed in the first line portion independently from passing the second current portion in the first line portion.

3. The magnetic memory device according to claim 1, wherein the first line portion is electrically connected in series to the second line portion.

4. The magnetic memory device according to claim 2, wherein the field line is U-shaped.

5. Method for operating a magnetic memory device comprising a plurality of magnetic units, each unit including:

a first magnetic tunnel junction comprising a first storage layer having a first storage magnetization and a first sense magnetic layer having a first sense magnetization;

a second magnetic tunnel junction comprising a second storage layer having a second storage magnetization and a second sense magnetic layer having a second sense magnetization;

a current line and a strap electrically connecting the first and second magnetic tunnel junctions in series;

a field line comprising a first line portion for passing a first current portion of a field current and a second line portion for passing a second current portion of the field current;

the current line being configured for providing an output signal that varies in response to the sum of the resistances of the first and second magnetic tunnel junctions of each of said plurality of magnetic units;

the method comprising:

providing a data state to be read in each magnetic unit such that the first storage magnetization direction is aligned in a direction opposed to the one of the second storage magnetization direction;

providing a field current to the field line comprising:

passing the first current portion having a first polarity in the first line portion, the first current portion generating a first magnetic field adapted for varying the first sense magnetization and a first resistance of the first magnetic tunnel junction;

passing the second current portion having a second polarity in the second line portion, the second current portion generating a second magnetic field adapted for varying the second sense magnetization direction and a second resistance of the second magnetic tunnel junction, the second current portion having a polarity opposed to the one of the first current portion, such as to align the first and second sense magnetizations in opposed directions;

measuring the sum of the resistances of the first and second magnetic tunnel junctions of said plurality of magnetic units; and determining the stored data state from the measured sum of the resistances.

6. The method according to claim 5, wherein said providing an input comprises:

passing the field current having a first polarity such as to align the first and second sense magnetizations in a first set of opposed directions; and passing the field current having a second polarity such as to align the first and second sense magnetizations in a second set of opposed directions wherein the orientation of each of the first and second sense magnetization is opposed to the one in the first set of opposed directions.

7. The method according to claim 6, wherein said measuring the sum of the resistances comprises measuring a first sum of the resistances when passing the field current having a first polarity and measuring a second sum of the resistances when passing the field current having a second polarity; and wherein said determining the stored data state comprises determining a relative difference between the first sum of the resistance and the second sum of the resistance.

8. The method according to claim 7, wherein the field current has an alternating polarity.

9. The method according to claim 5, wherein the first and second magnetic tunnel junction further comprises a first and second antiferromagnetic layer pinning the first and second storage magnetization at a low temperature threshold and freeing it at a high temperature threshold; and wherein said providing a data state comprises:

passing a heating current in the current line to heat the first and second magnetic tunnel junctions at the high temperature threshold such as to free the first and second storage magnetizations;

passing a write current in the field line such as to generate a first write magnetic field adapted for aligning the first storage magnetization in a first direction, and as to generate a second write magnetic field adapted for aligning the second storage magnetization in a second written direction opposed to the first written direction; and cooling the first and second magnetic tunnel junctions to the low temperature threshold such as to pin the first and second storage magnetizations in the stored state.

* * * * *